United States Patent
Hwang et al.

(10) Patent No.: US 11,791,935 B2
(45) Date of Patent: *Oct. 17, 2023

(54) DATA TRANSMISSION METHOD AND APPARATUS

(71) Applicant: LG Electronics Inc., Seoul (KR)

(72) Inventors: Seunggye Hwang, Seoul (KR); Kijun Kim, Seoul (KR); Soocheol Kyeong, Seoul (KR); Bonghoe Kim, Seoul (KR); Jinwoo Kim, Seoul (KR); Kwangseok Noh, Seoul (KR); Jongwoong Shin, Seoul (KR); Joonkui Ahn, Seoul (KR); Hyangsun You, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/686,015

(22) Filed: Mar. 3, 2022

(65) Prior Publication Data

US 2022/0190959 A1    Jun. 16, 2022

Related U.S. Application Data

(63) Continuation of application No. 16/806,452, filed on Mar. 2, 2020, now Pat. No. 11,271,680, which is a
(Continued)

(51) Int. Cl.
*H04L 1/00* (2006.01)
*H03M 13/13* (2006.01)

(52) U.S. Cl.
CPC .......... *H04L 1/0063* (2013.01); *H03M 13/13* (2013.01); *H04L 1/00* (2013.01); *H04L 1/005* (2013.01); *H04L 1/0052* (2013.01)

(58) Field of Classification Search
None
See application file for complete search history.

(56) References Cited

U.S. PATENT DOCUMENTS

| | | | | |
|---|---|---|---|---|
| 8,522,109 B2* | 8/2013 | Murakami | .......... | H03M 13/353 |
| | | | | 714/755 |
| 8,862,958 B2* | 10/2014 | Pi | .......... | H03M 13/09 |
| | | | | 714/752 |

(Continued)

FOREIGN PATENT DOCUMENTS

| | | |
|---|---|---|
| CN | 105227189 | 1/2016 |
| CN | 105337696 | 2/2016 |

(Continued)

OTHER PUBLICATIONS

Dubrova et al., "CRC-Based Message Authentication for 5G Mobile Technology," 2015 IEEE Trustcom/BigDataSE/ SPA, dated Aug. 22, 2015, 1:1186-1191.

(Continued)

*Primary Examiner* — Hong S Cho
(74) *Attorney, Agent, or Firm* — Fish & Richardson P.C.

(57) ABSTRACT

A disclosure of the present specification provides a method for transmitting data by a transmitter. The method may comprise the steps of: when a transport block (TB) is divided into n data blocks, adding additional information after each of the n data blocks; and adding a cyclic redundancy check (CRC) after the last additional information. Here, the CRC may be generated on the basis of the n data blocks, and the n pieces of additional information added after each of data blocks.

20 Claims, 20 Drawing Sheets

Related U.S. Application Data continuation of application No. 16/263,616, filed on Jan. 31, 2019, now Pat. No. 10,581,557, which is a continuation of application No. 16/065,504, filed as application No. PCT/KR2017/006408 on Jun. 19, 2017, now Pat. No. 10,411,834.

(60) Provisional application No. 62/401,842, filed on Sep. 29, 2016, provisional application No. 62/352,013, filed on Jun. 19, 2016.

(56) References Cited

U.S. PATENT DOCUMENTS

| | | | | |
|---|---|---|---|---|
| 2006/0188007 | A1* | 8/2006 | Daneshrad | H04B 1/7103 375/E1.032 |
| 2009/0006925 | A1* | 1/2009 | Pan | H04W 72/21 714/746 |
| 2009/0031201 | A1* | 1/2009 | Das | H04L 1/0053 714/E11.032 |
| 2012/0311400 | A1 | 12/2012 | Shen et al. | |
| 2015/0381209 | A1 | 12/2015 | Roh et al. | |
| 2017/0214413 | A1* | 7/2017 | Wang | H03M 13/6312 |

FOREIGN PATENT DOCUMENTS

| | | |
|---|---|---|
| EP | 3459192 | 3/2019 |
| JP | 2010531613 | 9/2010 |
| KR | 20090006795 | 1/2009 |
| KR | 1020090010927 | 1/2009 |
| KR | 20100098262 | 9/2010 |
| KR | 1020130014484 | 2/2013 |
| KR | 1020140015602 | 2/2014 |

OTHER PUBLICATIONS

Extended European Search Report in European Application No. 17815672.5, dated Sep. 29, 2020, 12 pages.

Guo et al., "Multi-CRC Polar Codes and Their Applications," IEEE Communications Letters, vol. 20, No. 2, dated Feb. 2016, 4 pages, XP011598246.

International Search Report in International Application No. PCTKR2017/006408, dated Oct. 24, 2017, 10 pages.

Japanese Office Action in Japanese Application No. 2018-566542, dated Sep. 10, 2019, 5 pages (with English translation).

MediaTek Inc., "Discussion on Polar Code Design and Performance," R1-165454, 3GPP TSG RAN WG1 Meeting #85bis, Nanjing, China, May 23-27, 2016, 7 pages.

NTT DOCOMO, "CRC related design of Polar codes," R1-1705756, 3GPP TSG RAN WG1 Meeting #88bis, Spokane, USA, dated Apr. 3-7, 2017, 6 pages, XP051252171.

United States Notice of Allowance in U.S. Appl. No. 16/065,504, dated Apr. 24, 2019, 6 pages.

Zhou et al., "Segmented CRC-Aided SC List Polar Decoding," 2016 IEEE 93rd Vehicular Technology Conference (VTC Spring), dated May 2016, 5 pages.

Extended Search Report in European Appln. No. 22195672.5, dated Dec. 13, 2022, 11 pages.

Giard et al., "Fast Low-Complexity Decoders for Low-Rate Polar Codes," CoRR, submitted on Mar. 18, 2016, arXiv:1603.05273v2, 8 pages.

\* cited by examiner

ENCODING ORDER

DECODING ORDER

DATA TRANSMISSION METHOD AND APPARATUS

CROSS-REFERENCE TO RELATED APPLICATIONS

This application is a continuation of U.S. application Ser. No. 16/806,452, filed on Mar. 2, 2020, which is a continuation of U.S. application Ser. No. 16/263,616, filed on Jan. 31, 2019, now U.S. Pat. No. 10,581,557, which is a continuation of U.S. application Ser. No. 16/065,504, filed on Dec. 18, 2018, now U.S. Pat. No. 10,411,834, which is the National Stage application under 35 U.S.C. § 371 of International Application No. PCT/KR2017/006408, filed on Jun. 19, 2017, which claims the benefit of U.S. Provisional Application No. 62/401,842, filed on Sep. 29, 2016, and U.S. Provisional Application No. 62/352,013, filed on Jun. 19, 2016. The disclosures of the prior applications are incorporated by reference in their entirety.

TECHNICAL FIELD

The present invention relates to next-generation mobile communication.

BACKGROUND

Thanks to success of long term evolution (LTE)/LTE-advanced (LTE-A) for 4G mobile communication, interest in future mobile communication, that is, 5G mobile communication, is increasing and studies thereon are continuing.

In next-generation mobile communication, that is, 5G mobile communication, a data service having a minimum speed of 1 Gbps seems to be realized.

In 5G mobile communication, a turbo code, a polar code, a low density parity check (LDPC) code, etc. are considered as a channel coding method. Thereamong, the polar code is used by combining successive cancelation (SC) decoding and list decoding. However, in the list decoding, there is no method of excluding an erroneous decoding path through error correction before final decoding ends. Accordingly, the erroneous decoding path finally remains, thereby increasing an error probability and decreasing list gain.

SUMMARY

Accordingly, the disclosure of this specification is to solve the above-described problems.

The object of the present invention can be achieved by providing a method of transmitting data at a transmitter. The method includes, when a transmission block (TB) is divided into n data blocks, attaching additional information after each of n blocks and attaching cyclic redundancy check (CRC) after last additional information. The CRC may be generated based on the n data blocks and n pieces of additional information attached to the data blocks.

The additional information may be a single parity bit or CRC.

(n–i)-th additional information may be generated with respect to an (n–i)-th data block.

(n–i)-th additional information may be generated with respect to a first data block to an (n–i)-th data block.

The (n–i)-th additional information may be generated with respect to a first data block to an (n–i)-th data block and with respect to first additional information and (n–i–1)-th additional information. The first additional information may be generated with respect to the first data block.

At least some of the n data blocks are different in a size.

The sizes of the n data blocks may decrease as a decoding order decreases.

Each of the n pieces of additional information may be used for error correction in a list decoding process. Error correction may include tracking and erasing an erroneous decoding path. At this time, if it is determined that errors occur in all decoding paths and thus there is no further decoding path available, decoding is early terminated.

When a maximum data block size is K and a size of the TB is N, the number n of data blocks may be determined by N/K. The n data blocks and the n pieces of additional information may be coded using a single encoder.

The value of K may be changed according to the data block.

The CRC may be scrambled as a user equipment (UE) identity.

If the additional information is CRC, all CRCs may be scrambled as one UE identity.

In another aspect of the present invention, provided herein is a transmitter for transmitting data. The transmitter may include a transceiver and a processor for controlling the transceiver. The processor may perform a process of, when a transmission block (TB) is divided into n data blocks, attaching additional information after each of n blocks; and a process of attaching cyclic redundancy check (CRC) after last additional information. The CRC may be generated based on the n data blocks and n pieces of additional information attached to the data blocks.

According to the disclosure of this specification, it is possible to solve the above-described problems.

Specifically, according to the disclosure of this specification, it is possible to determine whether decoding is performed well before decoding is completed. More specifically, according to the disclosure of this specification, by allowing early termination of decoding upon determining that errors occur in decoding before decoding is completed, it is possible to reduce computational load due to blind decoding of a receiver and to reduce complexity and delay.

DETAILED DESCRIPTION

Figure 1:
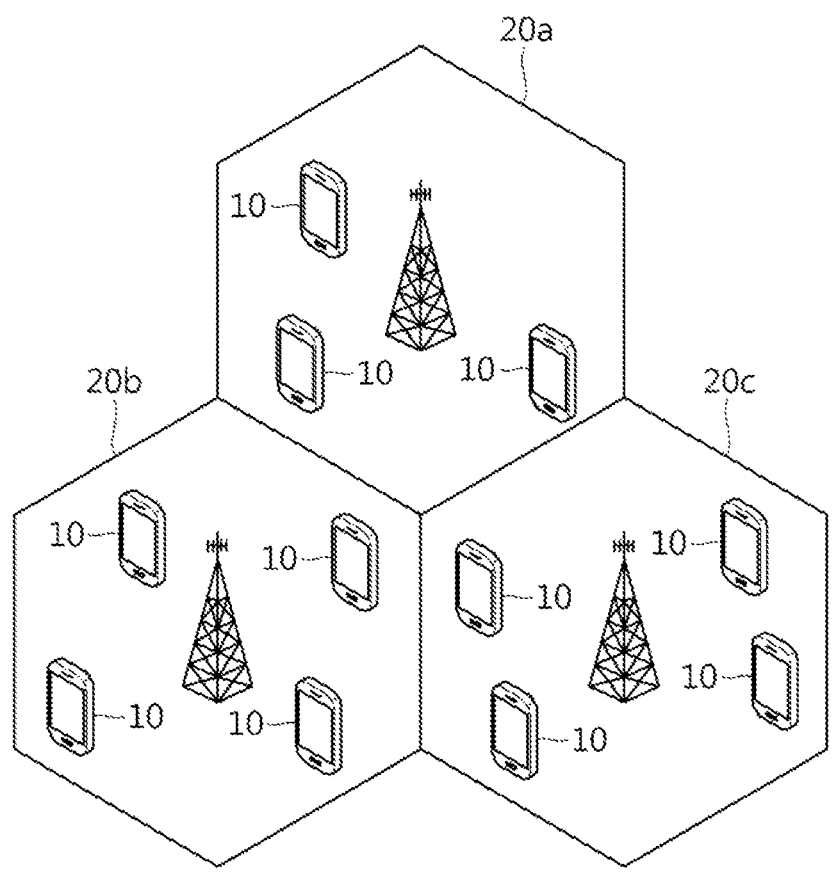
FIG. 1 is a view showing a wireless communication system.

Technical terms used in this specification are used merely to illustrate specific embodiments, and it should be understood that they are not intended to limit the present disclosure. So long as not defined otherwise, all terms used herein including technical terms may have the same meaning as generally understood by an ordinary person skilled in the art to which the present disclosure pertains, and should not be construed in an excessively comprehensive manner or an extremely restricted manner. In addition, if a technical term used in the description of the present disclosure is an erroneous term that fails to clearly express the idea of the present disclosure, it should be replaced by a technical term that can be properly understood by those skilled in the art. In addition, general terms used in the description of the present disclosure should be construed according to definitions in dictionaries or according to context, and should not be construed in an excessively restrained manner.

A singular representation may include a plural representation unless context clearly indicates otherwise. It will be understood that the terms 'comprising', 'include', etc., when used in this specification, specify the presence of several components or several steps and part of the components or steps may not be included or additional components or steps may be further included.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

It will be understood that when an element is referred to as being "connected to" another element, the element can be directly connected to the other element or intervening elements may also be present. In contrast, when an element is referred to as being "directly connected to" another element, there are no intervening elements present.

Exemplary embodiments of the present invention will be described below in detail with reference to the accompanying drawings in which the same reference numbers are used throughout this specification to refer to the same or like parts. In describing the present invention, a detailed description of known functions and configurations will be omitted when it may obscure the subject matter of the present invention. The accompanying drawings are used to help easily understood the technical idea of the present invention and it should be understood that the idea of the present invention is not limited by the accompanying drawings. The idea of the present invention should be construed to extend to any alterations, equivalents and substitutions besides the accompanying drawings.

The term base station used hereinafter refers to a fixed station communicating with a wireless device and may also be referred to as eNodeB (evolved-NodeB), eNB (evolved-NodeB), BTS (base transceiver system), access point, etc.

In addition, the term user equipment (UE) used hereinafter may be fixed or movable and may also be referred to as device, wireless device, terminal, mobile station (MS), user terminal (UT), subscriber station (SS), mobile terminal (MT), etc.

FIG. 1 is a view showing a wireless communication system.

Referring to FIG. 1, the wireless communication system includes at least one base station (BS) 20. Each base station 20 provides a communication service to specific geographical regions (generally, referred to as cells) 20a, 20b and 20c. The cell may be divided into a plurality of regions (referred to as sectors).

A UE generally belongs to one cell and a cell, to which the UE belongs, is referred to as a serving cell. A base station for providing a communication service to the serving cell is referred to as a serving BS. The wireless communication system is a cellular system and thus other cells are located adjacent to the serving cell. The other cells located adjacent to the serving cell are referred to as neighbor cells. BSs for providing communication services to the neighbor cells are referred to as neighbor BSs. The serving cell and the neighbor cell are determined based on the UE.

Hereinafter, downlink means communication from the BS 20 to the UE 10 and uplink means communication from the UE 10 to the BS 20. On downlink, a transmitter may be a portion of the BS 20 and a receiver may be a portion of the UE 10. On uplink, a transmitter may be a portion of the UE 10 and a receiver may be a portion of the BS 20.

Hereinafter, an LTE system will be described in greater detail.

Figure 2:
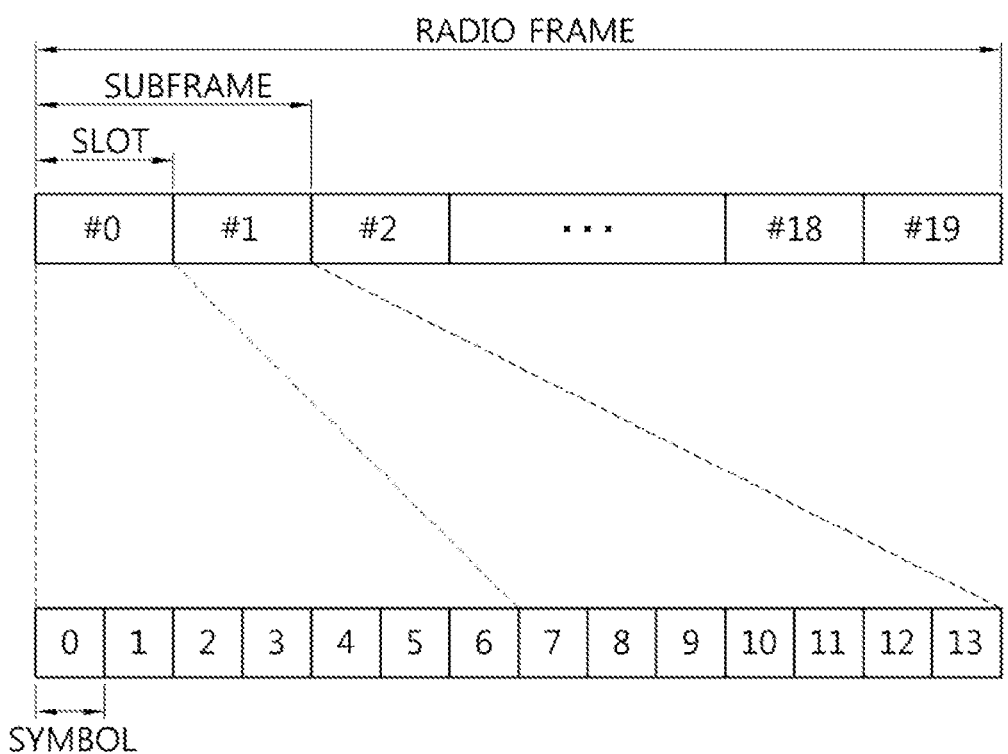
FIG. 2 is a view showing the structure of a radio frame according to FDD in 3GPP LTE.

FIG. 2 is a view showing the structure of a radio frame according to FDD in 3GPP LTE.

Referring to FIG. 2, the radio frame includes 10 subframes and one subframe includes two slots. The slots in the radio frame are numbered from 0 to 19. A time required to transmit one subframe is referred to as a transmission time interval (TTI). The TTI may be a scheduling unit for data transmission. For example, the length of one radio frame may be 10 ms, the length of one subframe may be 1 ms, and the length of one slot may be 0.5 ms.

The structure of the radio frame is merely exemplary and the number of subframes included in the radio frame or the number of slots included in the subframe may be variously changed.

Meanwhile, one slot may include a plurality of orthogonal frequency division multiplexing (OFDM) symbols. The number of OFDM symbols included in one slot may vary according to cyclic prefix (CP).

One slot includes $N_{RB}$ resource blocks (RBs) in the frequency domain. For example, in an LTE system, the number of RBs, that is, $N_{RB}$, may be any one of 6 to 110.

The RB is a resource allocation unit and includes a plurality of subcarriers in one slot. For example, if one slot includes 7 OFDM symbols in the time domain and the RB includes 12 subcarriers in the frequency domain, one RB may include 7×12 resource elements (REs).

<Next-Generation Mobile Communication Network>

As mobile communication based on the 4G LTE/international mobile telecommunications (IMT) standard has been successfully commercialized, research into next-generation mobile communication (fifth-generation mobile communication) is ongoing. The fifth-generation mobile communication system aims at higher capacity than 4G LTE and can increase the density of mobile broadband users and support device to device (D2D), high stability and machine type communication (MTC). Research into and development of the 5G mobile communication system aim at lower latency and lower battery consumption than the 4G mobile communication system in order to better implement the Internet of things. For such 5G mobile communication, new radio access technology (New RAT or NR) may be proposed.

In NR, reception from a base station may use downlink subframes and transmission to the base station may use uplink subframes. This scheme is applicable to paired spectra and unpaired spectra. A pair of spectra means that two carrier spectra are included for downlink and uplink operation. For example, in a pair of spectra, one carrier may include a pair of a downlink band and an uplink band.

Figure 3:
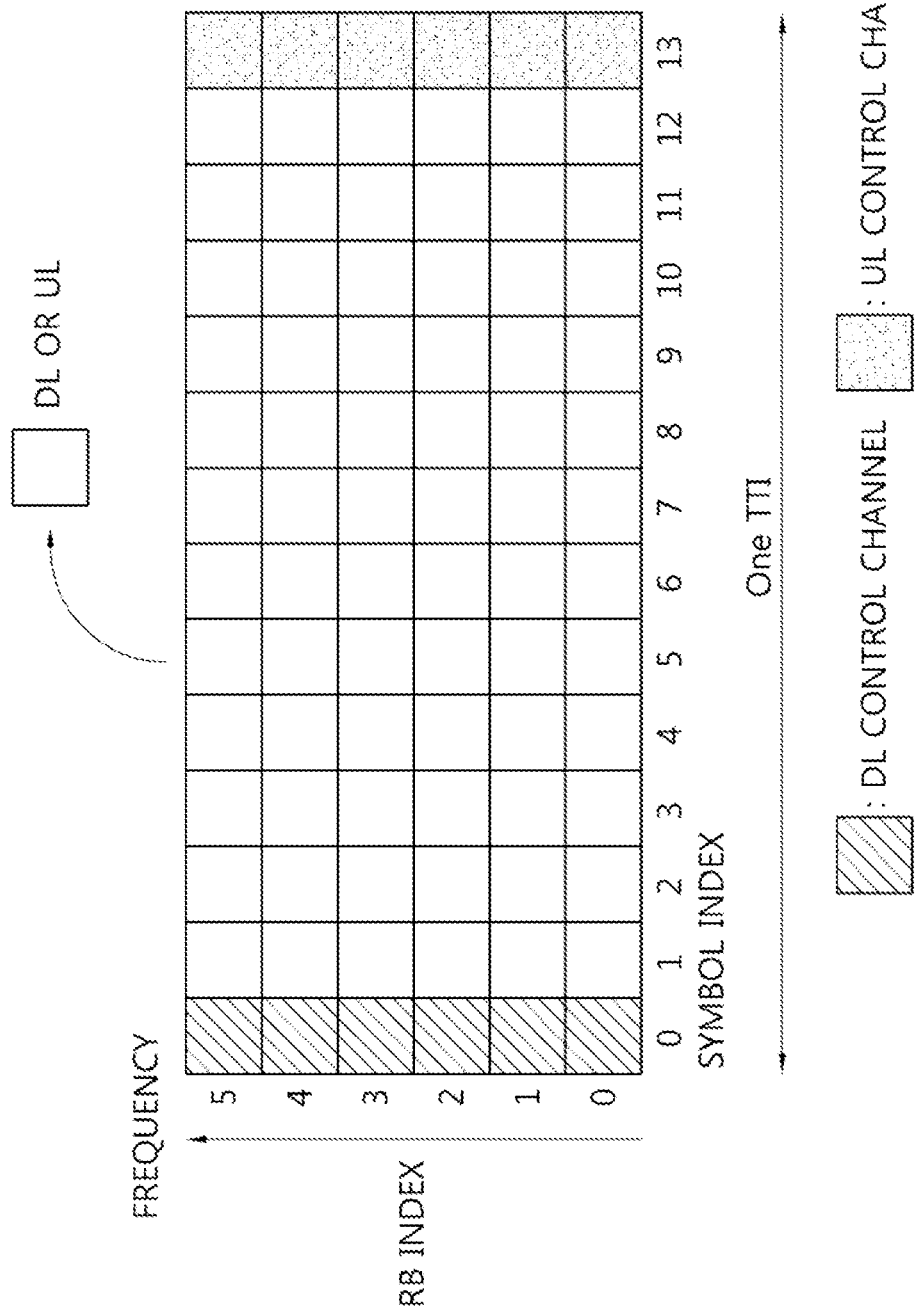
FIG. 3 is a view showing an example of a subframe type in NR.

FIG. 3 is a view showing an example of a subframe type in NR.

The transmission time interval (TTI) shown in FIG. 3 may be referred to as a subframe or slot for NR (or new RAT). The subframe (or the slot) of FIG. 3 may be used in an NR (or new RAT) TDD system in order to minimize data transmission delay. As shown in FIG. 3, the subframe (or the slot) includes 14 symbols, similarly to a current subframe. The front symbol of the subframe (or the slot) may be used for a DL control channel and the rear symbol of the subframe (or the slot) may be used for a UL control channel. The remaining symbols may be used for DL data transmission or UL data transmission. According to such a subframe (or slot) structure, downlink transmission and uplink transmission may be sequentially performed in one subframe (or slot). Accordingly, downlink data may be received in the subframe (or the slot) and uplink ACK/NACK may be transmitted in the subframe (or the slot). Such a subframe (or slot) structure may be referred to as a self-contained subframe (or slot). When such a subframe (or slot) structure is used, a time required to retransmit data which has been erroneously received can be reduced, thereby minimizing final data transmission latency. In the self-contained subframe (or slot) structure, a time gap may be necessary in a process of switching from a transmission mode to a reception mode or from a reception mode to a transmission mode. To this end, in the subframe structure, when switching from DL to UL, some OFDM symbols may be set as a guard period (GP).

Requirements of the 5G system include latency, peak data rate, error correction, etc. The 5G system, which will be used not only in a mobile communication system but also in ultra-high-resolution media streaming, the Internet of things, cloud computing, autonomous vehicles, etc., aims at performance much higher than the requirements of the LTE system in various areas.

The 5G system aims at 1 ms which is 1/10 the latency of the LTE system. Such short latency is an important indicator in an area directly related to human life, such as autonomous vehicles. The 5G system aims at a high transmission rate. The 5G system is expected to provide high-capacity high-speed communication such as high-quality media service streaming services with a maximum transmission rate which is 20 times that of the LTE system and a sensible transmission rate which is 10 to 100 times that of the LTE system. Error correction capability reduces a data retransmission rate, thereby improving latency and a data transfer rate.

As a 5G channel coding method, first, a turbo code, a polar code, a low density parity check (LDPC) code, etc. are considered.

First, the turbo code refers to a method of concatenating convolutional codes in parallel and applies different arrangements of the same sequence to two or more component codes. In the turbo code, a soft output iterative decoding method is used as a decoding method. Since the basic concept of turbo code decoding is to improve performance by exchanging information on each bit within a decoding period and using the information for next decoding, it is necessary to obtain soft output in the decoding process of the turbo code. Such a probabilistic iterative decoding method leads to excellent performance and speed.

Next, the LDPC code is based on the characteristics of an LDPC iterative decoding scheme, in which error correction capability per bit is improved but calculation complexity per bit is maintained, by increasing the length of the code. In addition, since the code may be designed such that decoding operation is performed in parallel, decoding of a long code can be performed at a high speed.

Finally, the polar code has low coding and low decoding complexity and is a first error correction code which has theoretically been proven to achieve a channel capacity in a general binary discrete memoryless symmetric channel. In contrast to the turbo code and the LDPC code using the iterative decoding process, the polar code uses a combination of successive cancelation (SC) decoding and list decoding. In addition, the polar code improves performance through pipelining, unlike the LDPC for improving performance through a parallel process.

Figure 4A:
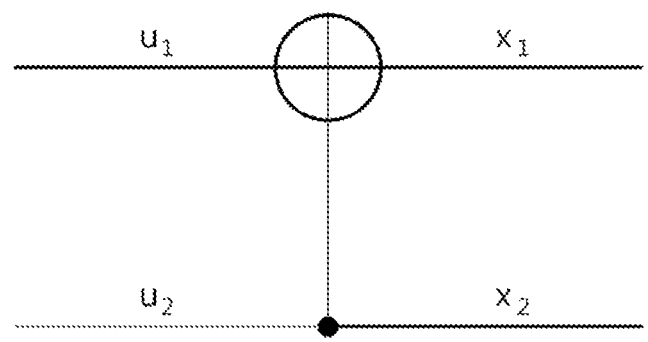
FIG. 4A is a view showing the basic concept of a polar code and FIG. 4B is a view showing the structure of an SC decoder.
Figure 4B:
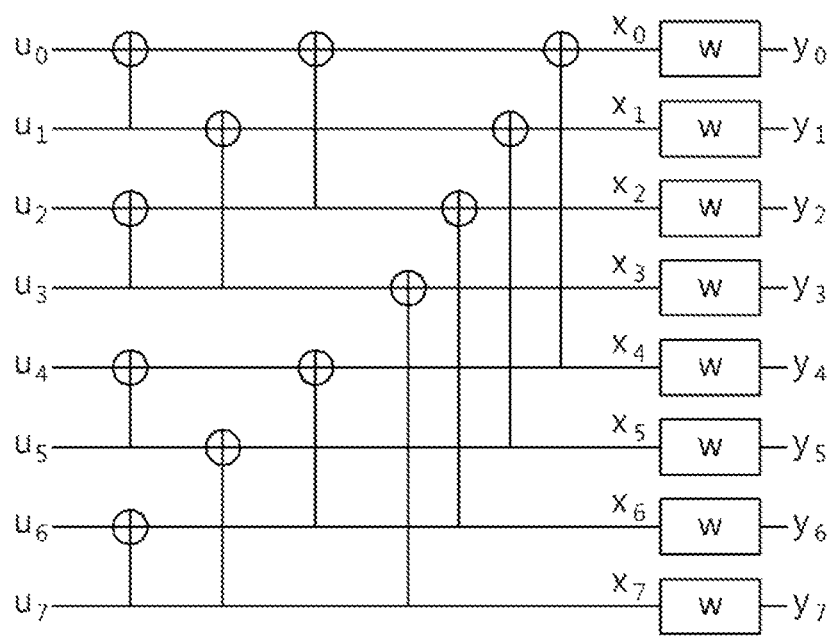

FIG. 4A is a view showing the basic concept of a polar code and FIG. 4B is a view showing the structure of an SC decoder.

Referring to FIG. 4A, different inputs $u_1$ and $u_2$ undergo different channels and thus x1 and x2 are output. At this time, assume that input $u_2$ passes through a relatively good channel and input $u_1$ passes through a relatively bad channel. The channel means influence of an encoder. If the structure of FIG. 4A is repeated, input $u_2$ passing through the good channel gradually becomes better and input $u_1$ passing through the bad channel gradually becomes worse, thereby obtaining the structure shown in FIG. 4B. This is referred to as polarization.

The structure shown in FIG. 4B may be generated by a Kronocker product of a 2×2 kernel matrix. Accordingly, an encoder is always created in the form of the exponent of 2.

In FIG. 4B, assume that the channel experienced by input $u_7$ is better than the channel experienced by input $u_0$. That is, assume that the larger the index, the better the channel.

The polar code means a method of mapping data to a good channel and mapping a frozen bit (that is, known bit information such as 0) to a bad channel, using polarization effects.

At this time, a code rate is determined by (the number of data bits)/(the number of data bits+the number of frozen bits).

Figure 5:
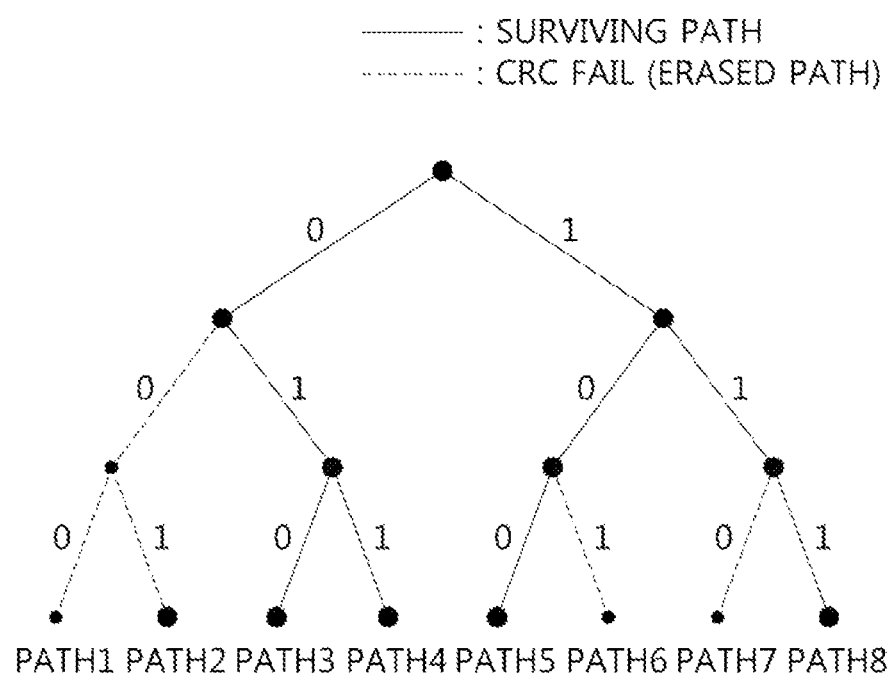
FIG. 5 is a view showing the concept of a list decoding method.

FIG. 5 is a view showing the concept of a list decoding method.

As shown in FIG. 5, the list decoding method means a method of maintaining L (L being greater than 1) or more decoding candidates in a sequential decoding process such as trellis based or successive cancelation (SC) decoding and selecting a best decoding path by determining a measurement value such as a log likelihood ratio (LLR) when decoding of all bits is completed. Here, the decoding path means a path on which selection of each bit is stored in the sequential decoding process.

In the existing list decoding, after final decoding of all bits is completed, single cyclic redundancy check (CRC) was used for error correction to determine whether an error has occurred in all paths. Here, error correction in list decoding means that an erroneous decoding path of a plurality of lists is excluded.

In other words, in the existing list decoding, there is no method of excluding the erroneous decoding path through error correction before final decoding is completed. Accordingly, the erroneous decoding path finally remains, which may increase an error probability or decrease list gain. That is, in existing list decoding, a false alarm rate (FAR) increases. Here, the FAR refers to a probability that an incorrect signal is identified as a correct signal and is decoded, thereby passing CRC.

<Disclosure of this Specification>

One disclosure of this specification proposes a multiple-cyclic redundancy check (CRC) structure in order to solve the above-described problem (the problem that erroneous decoding cannot be excluded through error correction using CRC before final decoding is completed in list decoding. Specifically, according to one disclosure of this specification, a method of using at least one of multiple CRCs for error correction before decoding is completed to improve decoding performance is proposed. According to this method, it is possible to determine whether an error occurs at an early stage while using list decoding. In addition, since a block error rate (BLER) can be improved, this method may be efficient.

Another disclosure of this specification proposes a method of using a single parity bit for the same purpose instead of CRC.

In this specification, for convenience of description, although a channel coding scheme using a polar code is described, the disclosure of this specification is generally applicable to channel coding schemes, to which list decoding is applicable.

I. Multi-Level CRC

As in a polar decoder, if channel coding using successive cancelation (SC) decoding is used, due to the properties of an SC decoder, an error may occur in a step of performing SC to generate error propagation, thereby deteriorating performance. In the case of successive cancelation list (SCL) decoding, error propagation may maintain an erroneous path as a list, thereby decreasing list gain. A method of applying multiple CRCs to perform multi-level CRC check in order to reduce influence of error propagation in a receiver using the SCL is proposed.

In the case of using M-level CRC, the following operations may be performed. First, data may be divided into M blocks. At this time, all the sizes of the blocks may be the same. Alternatively, the sizes of the blocks may be different from each other. The sizes of the data blocks may be set to reduce decoding error as much as possible. When data for different purposes are transmitted in one transmission block (TB), the sizes of the blocks may be set considering the size of each datum. Multiple CRCs are generated by the number of blocks and CRC generation rules may be equal or different with respect to all CRCs. When CRC generation rules are different, the sizes of the blocks matching CRCs may be different. The CRC generation rules may be controlled considering tradeoff between error correction and error detection performance and overhead size. Examples thereof will be described with reference to FIG. 6.

Figure 6:
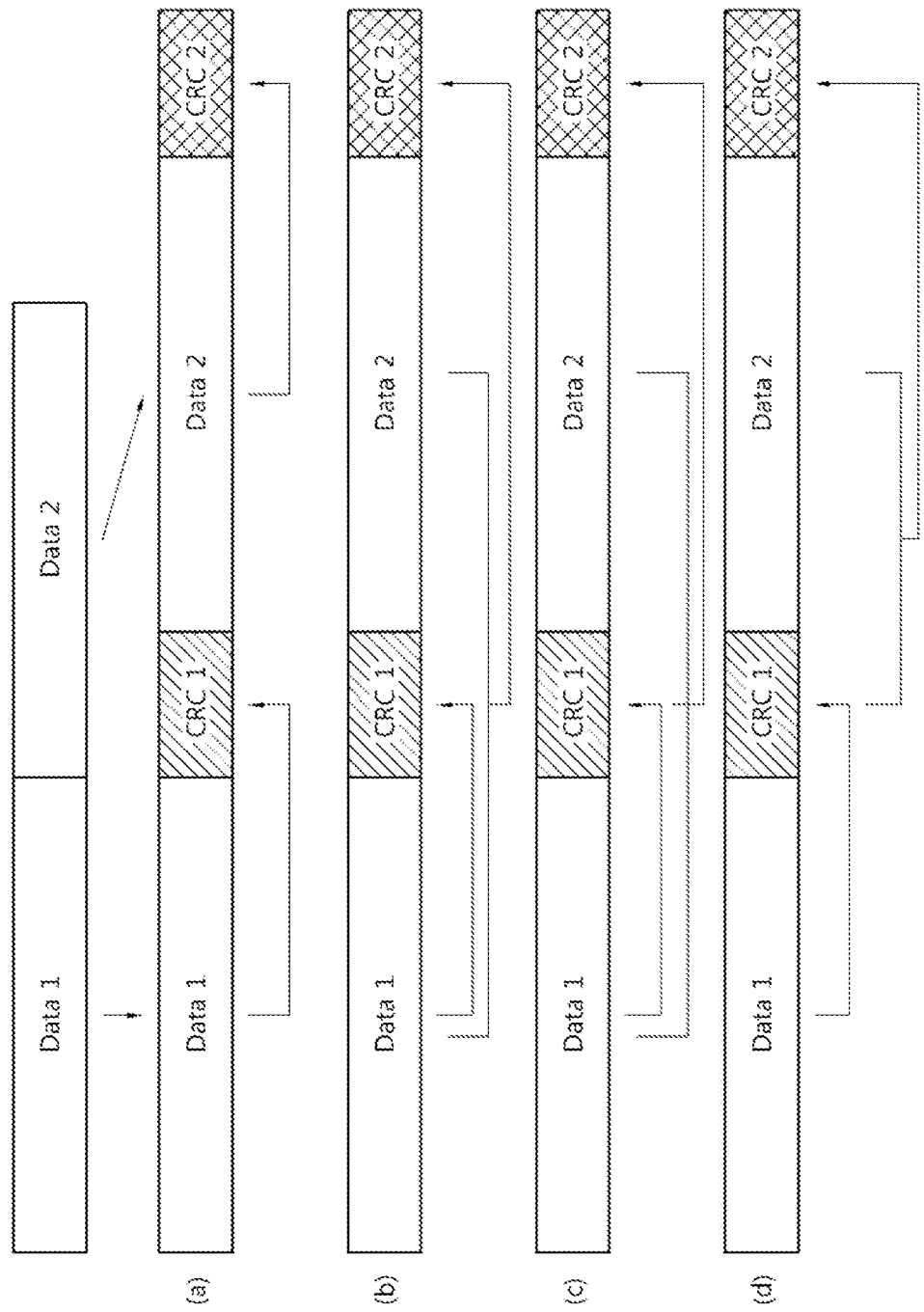
FIG. 6 is a view showing examples of generating multiple CRCs when one TB is divided into two data blocks.

FIG. 6 is a view showing examples of generating multiple CRCs when one TB is divided into two data blocks.

FIG. 6($a$) shows an example of calculating CRC by reflecting a corresponding data block. In this case, CRC is calculated by reflecting only the size of the data block directly associated therewith, thereby reducing complexity. In other words, if a transmission block (TB) is divided into n data blocks, CRC may be calculated with respect to each of n blocks. Therefore, (n−i)-th CRC may be calculated with respect to an (n−i)-th data block.

FIG. 6($b$) shows an example of calculating CRC using a total sum of the data blocks. In FIG. 6($b$), CRC1 is generated by reflecting only Data 1 and CRC2 is generated by using Data 1 and Data 2. In other words, if a TB is divided into n data blocks, (n−i)-th CRC may be generated with respect to a first data block to an (n−i)-th data block. This is characterized in that CRC calculated later has a value calculated by reflecting all data.

FIG. 6($c$) shows an example of calculating CRC by reflecting all blocks (data blocks and CRC blocks). This example is advantageous in that, although rules used to calculate CRCs or the lengths of CRCs are different, all preceding blocks affect rear CRC. In other words, if a TB is divided into n data blocks, the (n−i)-th CRC may be generated with respect to first to (n−i)-th data blocks and first to (n−i−1)-th CRCs. Here, the first CRC may be generated with respect to the first data block.

FIG. 6($d$) shows an example of calculating CRC by reflecting a data block directly associated therewith and previous CRC blocks thereof. In this case, since CRC is calculated by reflecting some of influence of the preceding data block and the size of the block necessary for simultaneous calculation is not large, it is possible to reduce complexity. In the above examples, for convenience, assume that one TB is divided into two data blocks. However, the above examples are applicable to the case where one TB is divided into two or more blocks and two or more multiple CRCs are used. In addition, although the sizes of the data blocks and the CRCs are the same for convenience in FIG. 6, the above-described methods are applicable to the case where the sizes of the data blocks and the CRCs are different.

When applying multiple CRCs, the number of used data blocks and CRCs may be set according to various methods.

Figure 7:
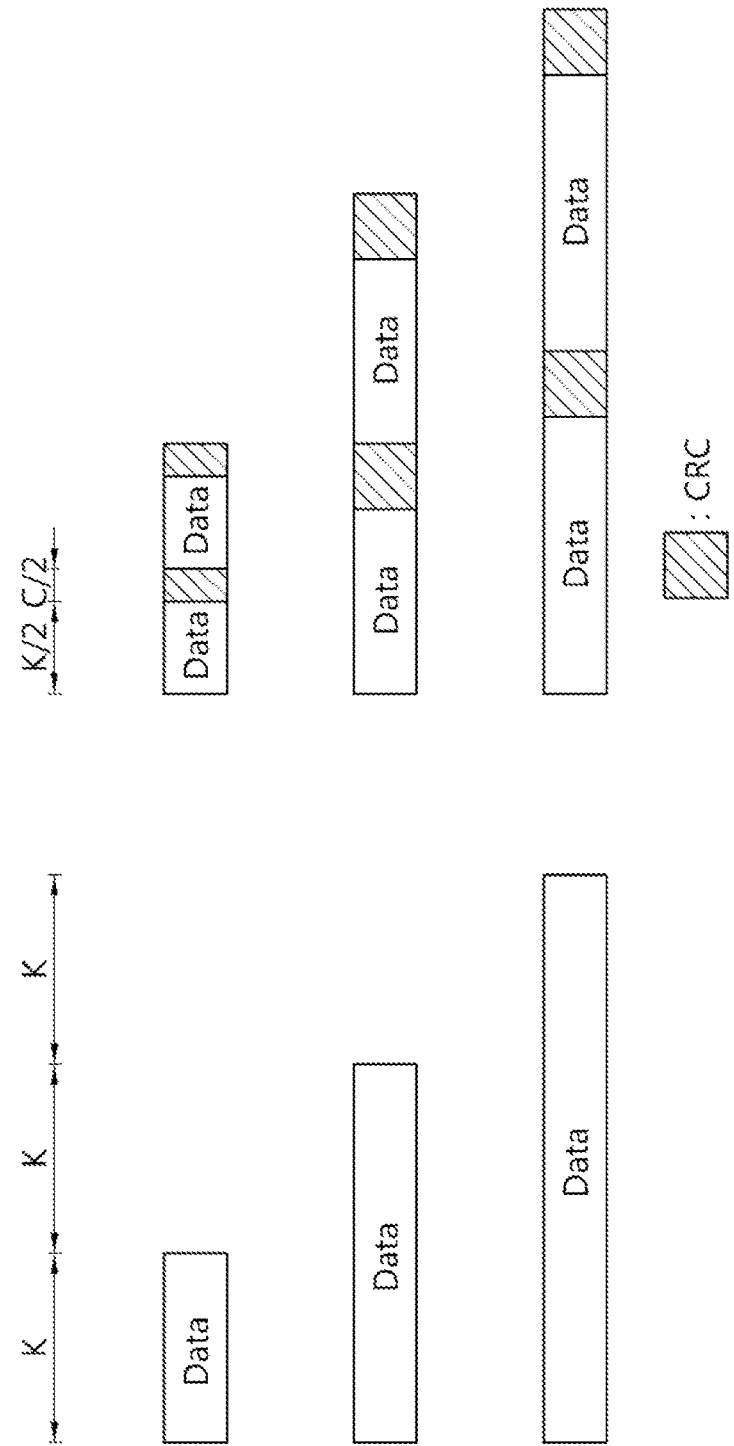
FIG. 7 is a view showing a method of keeping a ratio of data to CRC constant as long as the size of CRC does not exceed a maximum value in a state of fixing the number of multiple CRCs.

1) As a first method, there is a method of predetermining the number of multiple CRCs used and dividing data blocks according to the predetermined number. This method is advantageous in that the same number of CRCs may always be used regardless of a transport block size (TBS). At this time, the size of CRC may always be fixed or adjusted according to the size of the data block. For the purpose of keeping a ratio of data to CRC constant, the size of CRC may be adjusted according to the size of the data block. In addition, the size of CRC may be set to a maximum value and may not be set to be greater than the maximum value, in order to reduce overhead of CRC. In a method of adjusting the size of CRC according to the size of the data block in a state in which the maximum size of CRC is fixed, a portion of a CRC generation polynomial designed based on the maximum size of CRC may be selected. Alternatively, a method of pre-defining all CRC generation rules according to various sizes may be used. A method of keeping a ratio of data to CRC constant within a range within which the size of CRC does not exceed a maximum value in a state in which the number of multiple CRCs is fixed is shown in FIG. 7.

Figure 8:
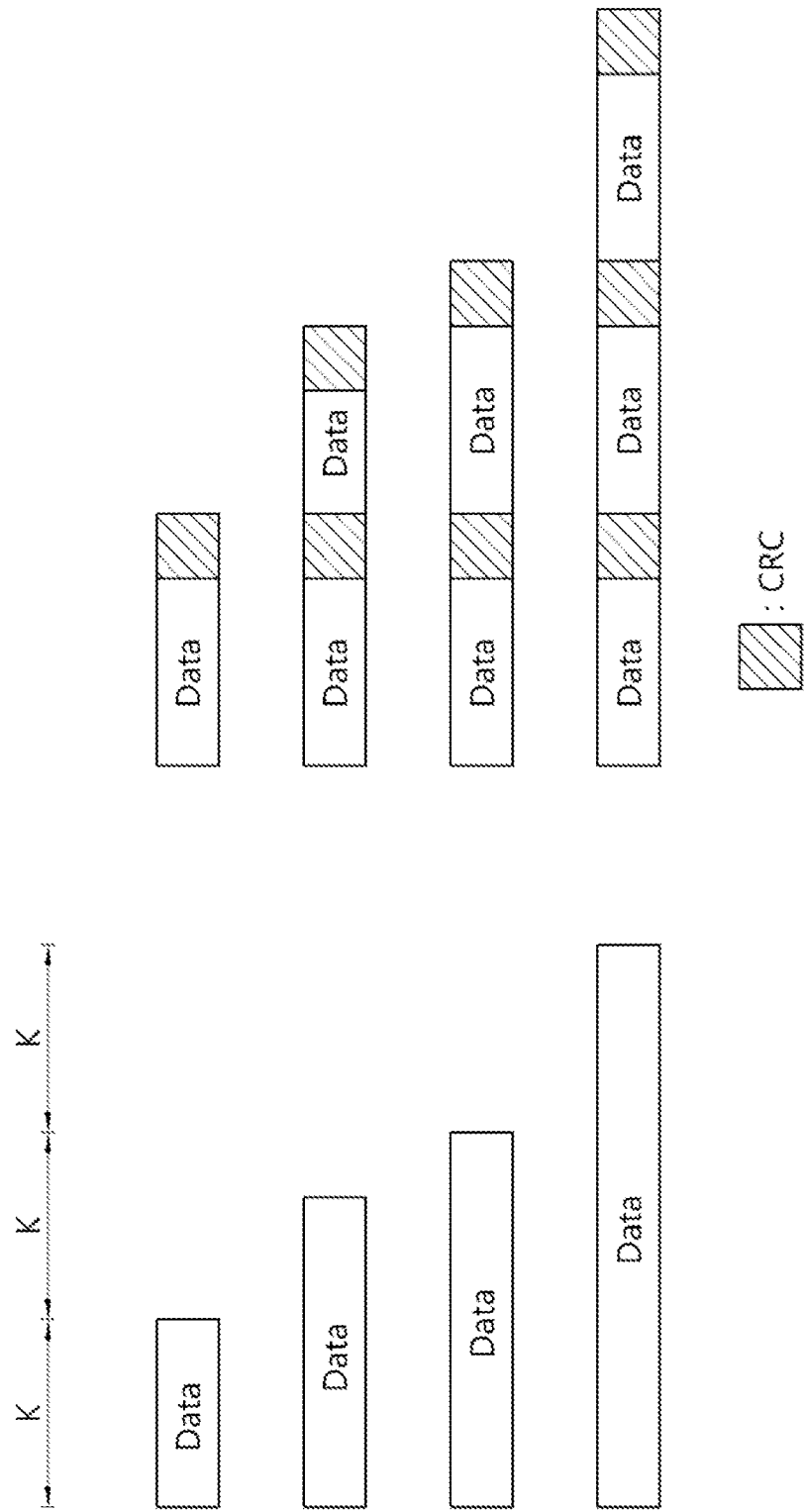
FIG. 8 is a view showing an example of flexibly changing the number of multiple CRCs.

2) As a second method, there is a method of fixing a maximum data block size and adjusting the number of CRCs according to the TBS. For example, if the maximum data block size is fixed to K and the TBS is N, the number of CRCs may be set to the smallest value of the integers greater than N/K. Accordingly, the number of multiple CRCs may be flexibly changed according to the TBS and the position of the CRC may always be constant. For example, as shown in FIG. 8, the number of multiple CRCs may be changed according to the TBS.

3) As a third method, there is a combination of the two methods. For example, the method of fixing the number of multiple CRCs and adjusting the size of CRC is applied when the size of the data block is equal to or less than a predetermined size and the method of fixing the size of CRC and increasing the number of multiple CRCs when the size of the data block is greater than the predetermined size. At this time, a reference data block size may be set to a data block size reaching a maximum CRC size value. This is characterized in that influence of overhead caused by CRC is reduced in the data block having a small size and capability of CRC may be maintained in a data block having a large size.

The number of multiple CRCs may be greater than the number of data blocks. For example, multiple CRCs respectively corresponding to data blocks may be present and one or more CRCs for checking all data blocks and multiple CRCs may be present. In this case, when the total number of data blocks is N, the number of multiple CRCs may be N+1 or more.

II. Single Parity Bit

In order to improve performance of list decoding, a single parity bit may be used instead of multiple CRCs. The reason why the single parity bit is used is as follows.

First, multiple CRCs have the following disadvantages. When CRC is generated by a plurality of polynomials, an additional J-bit CRC polynomial is necessary for distinguishment from the same CRC as the purpose used in the existing LTE and thus a calculation equation becomes complicated. In contrast, when CRC is generated by one polynomial, permutation operation of a CRC generation matrix is necessary to maintain correlation between data and CRC. Therefore, complexity of multiple CRCs may be higher than that of the single parity bit always having the same generation equation (without an additional calculation process). In addition, the CRC generation process has a disadvantage in that computational load is larger than that of a process of generating a single parity bit. Similarly, a process of checking CRC has a disadvantage in that computational load is larger than that of a process of checking a single parity bit.

In contrast, there is an advantage that the single parity bit may always be generated regardless of the position where the parity bit is added. In addition, there is an advantage that computational load is small in the process of generating or checking the parity bit.

The single parity bit added to the data block according to this disclosure may be used to prevent error propagation due to selection of the wrong list, similarly to the above-described multiple CRCs. A method of using the single parity bit may have lower error detection capability than the method of using multiple CRCs but may relatively reduce overhead.

In list decoding, the single parity bit may be used to check whether decoding of one or more data blocks is correct to maintain only a correct path. For example, in a list decoding operation for storing L paths as a list, it is possible to improve reliability of the list by determining whether an error occurs in data through XOR operation of all bits of a specific data block and the single parity bit and including only the correct paths in a candidate path.

A plurality of single parity bits may be located among a plurality of data blocks, into which one TB is divided. Multiple single parity bits may be generated as shown in FIG. 9.

Figure 9:
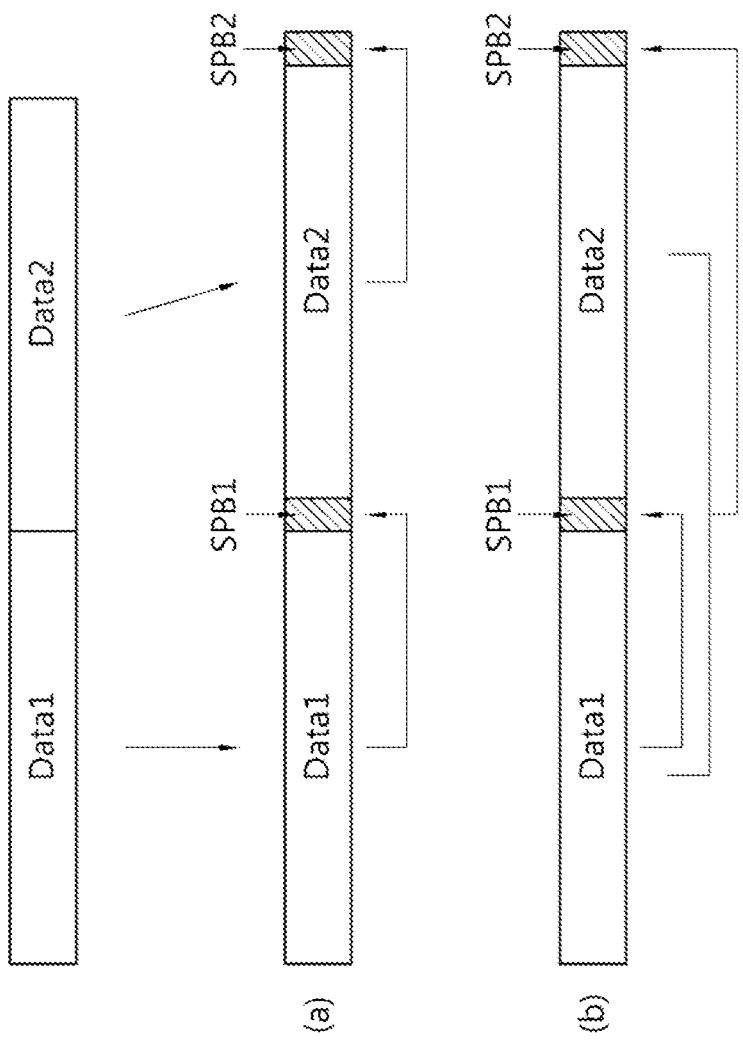
FIG. 9 is a view showing an example of generating multiple single parity bits when one TB is divided into two data blocks.

FIG. 9 is a view showing an example of generating multiple single parity bits when one TB is divided into two data blocks.

Although an example of dividing one TB into two data blocks is used for convenience of description in FIG. 9, the description may be generally used for a plurality of single parity bits, e.g., two or more single parity bits. FIG. 9(*a*) shows an example of generating single parity bits by reflecting only a portion corresponding to each of two data blocks. FIG. 9(*b*) shows an example of generating single parity bits by reflecting influence of all preceding data blocks.

When the single parity bits are applied, the numbers of used data blocks and single parity bits may be determined using various methods.

1) As a first method, there is a method of fixing the number of single parity bits used and dividing data blocks according the number of single parity bits. In this method, the same number of single parity bits is always used regardless of the TBS.

Figure 10:
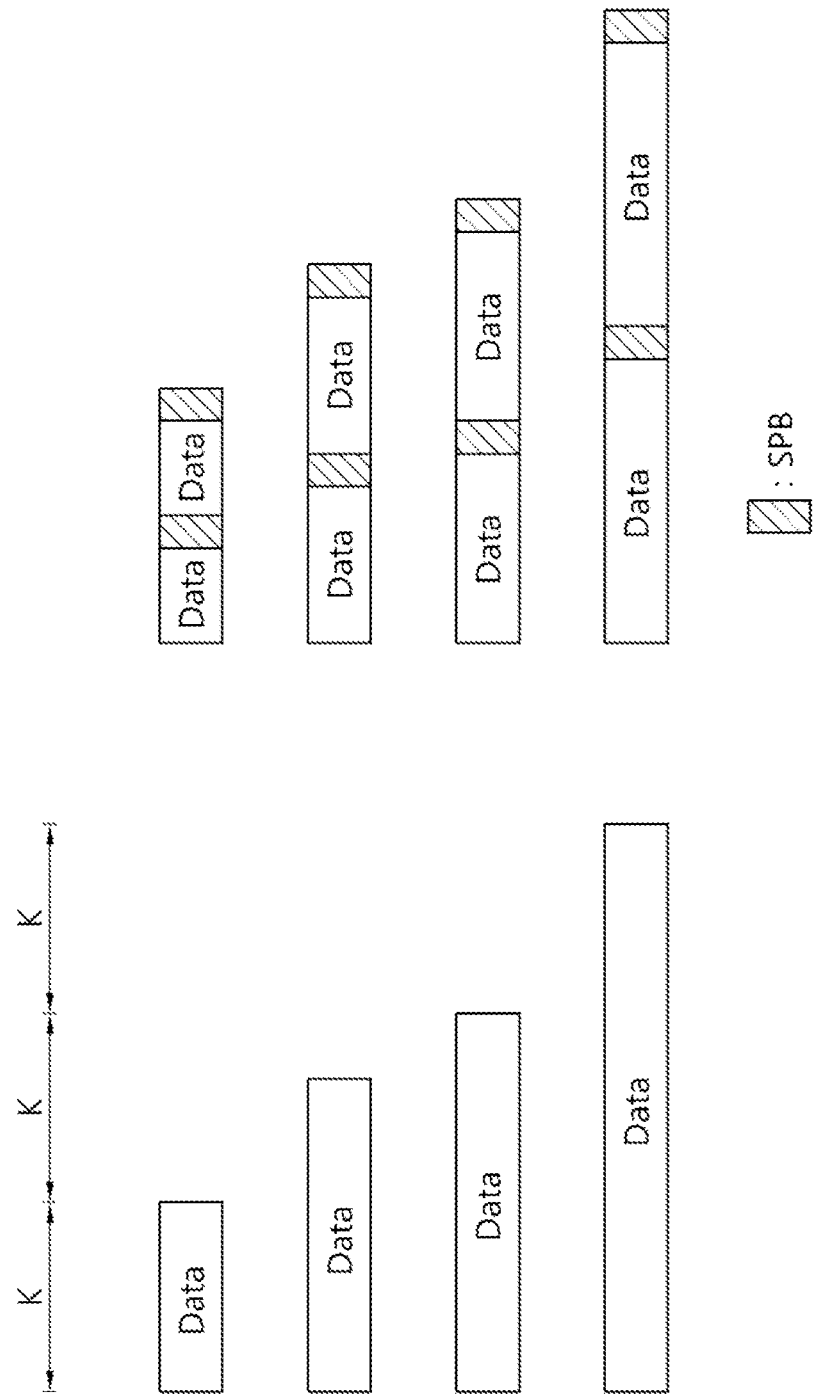
FIG. 10 is a view showing an example of a method of using a single parity bit according to TBS in a state of using two single-parity bits.

An example of a method of using a single parity bit according to the TBS when two single parity bits are used is shown in FIG. 10.

Figure 11:
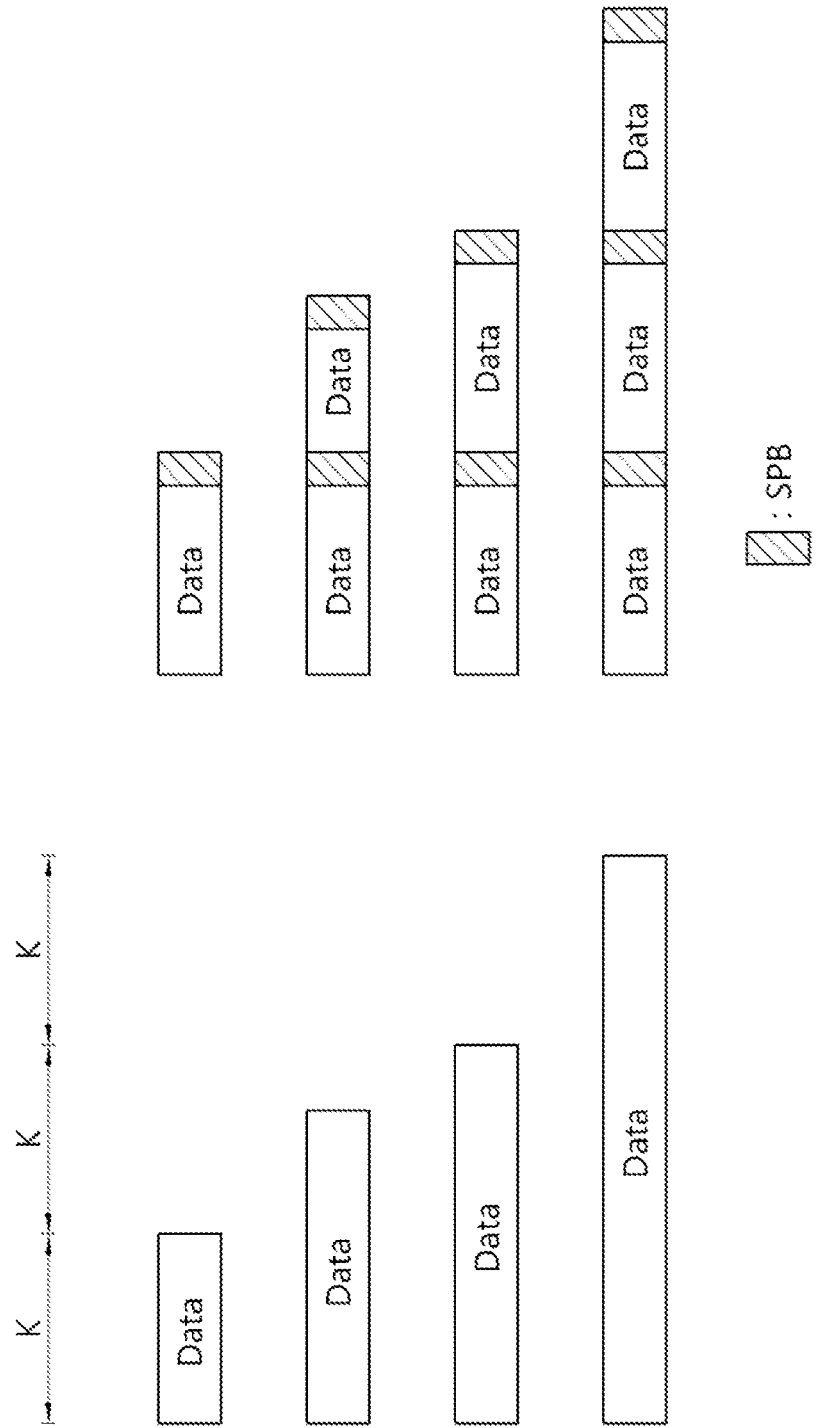
FIG. 11 is an example of flexibly changing the number of single parity bits.

2) As a second method, there is a method of fixing a maximum data block size supportable by one single parity bit and adjusting the number of single parity bits according to the TBS. For example, if the maximum data block size is fixed to K and the TBS is N, the smallest value of integers greater than N/K may be set as the number of single parity bits. Accordingly, the number of single parity bits may be flexibly changed according to the TBS and the position of the single parity bit may always be constant. An example of flexibly changing the number of single parity bits is shown in FIG. 11.

3) As a third method, there is a combination of the two methods. For example, a method of fixing the number of single parity bits is applicable when the size of the data block is equal to or less than a predetermined size and a method of increasing the number of single parity bits is applicable when the size of the data block is greater than the predetermined size. This is characterized in that influence of overhead caused by the single parity bit is reduced in the data block having a small size and capability of the single parity bit may be maintained in a data block having a large size.

The number of single parity bits may be greater than the number of data blocks. For example, one single parity bit corresponding to each data block may be present and one or more single parity bits for checking all data blocks and the single parity bits may be present. In this case, when the total number of data blocks is N, the number of single parity bits may be equal to or greater than N+1.

The single parity bit and the multiple CRCs may be independently used and a combination of two technologies may be applied. When a combination of two technologies is used, the single parity bit is used in the middle of the data blocks and CRCs may be used in the last part of the data blocks. This will be described with reference to FIG. 12.

Figure 12:
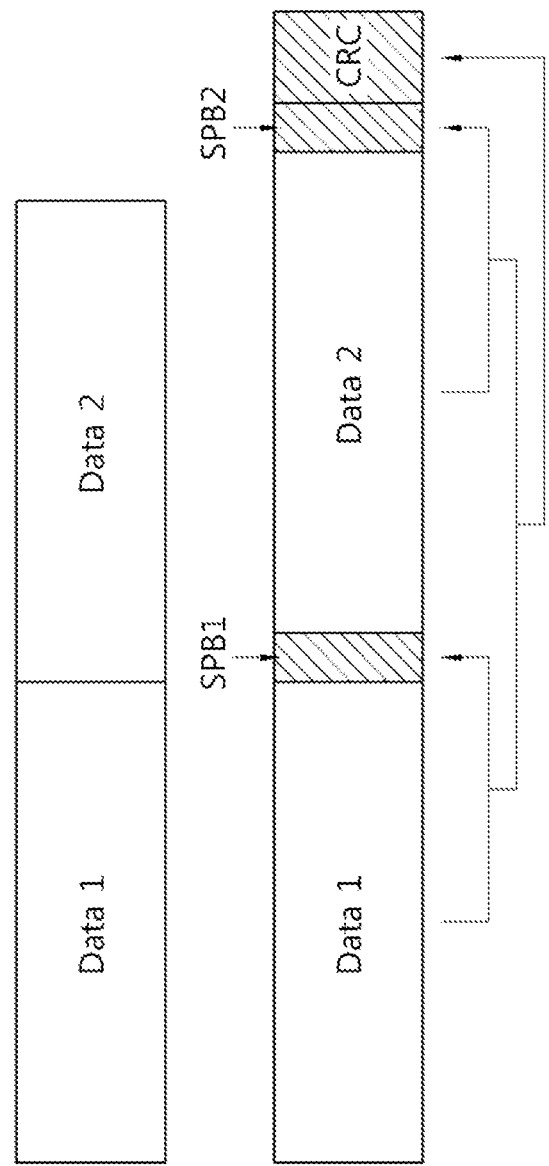
FIG. 12 is a view showing an example of using a combination of a single parity bit and multiple CRCs.

FIG. 12 is a view showing an example of using a combination of a single parity bit and multiple CRCs.

As can be seen from FIG. 12, when one TB is divided into two data blocks, the single parity bit may be generated with respect to the part corresponding to each data block. That is, a single parity bit SPB1 may be generated with respect to Data 1 and a single parity bit SPB2 may be generated with respect to Data 2. CRC may be added to the last part. The CRC of the last part may be used for error detection or error correction as described below with reference to FIGS. 15A and 15B.

III. List Decoding Enhancement Method Using multiple CRCs or Single Parity Bit

In this chapter, a method of enhancing decoding performance using multiple CRCs and a single parity bit in a list decoding process will be described. In the following description, error correction operation is a process of excluding an erroneous decoding path from among a plurality of lists and one or more decoding paths may be selected regardless of reliability of the decoding path. If errors are detected in all decoding paths of the list in the error correction process, early termination in which the decoding process is stopped is performed. In the following description, error detection operation is a process of checking errors with respect to one decoding path having highest reliability among a plurality of lists. When an error occurs in a corresponding path, a receiver does not perform error checking and determines that decoding fails, even when there is another decoding path in the list. At this time, a log likelihood ratio (LLR) value may be used as reliability. The LLR value may be obtained in a process of performing decoding and is changed according to the decoding path.

In this chapter, a method of tracking and erasing erroneous decoding paths before decoding of all bits is completed in the list decoding process will be described.

Since there is no method of performing error correction with respect to the erroneous decoding path before final decoding is completed in the existing list decoding, the corresponding decoding path may increase error probability or decrease list gain in a process of selecting a final decoding path.

In order to overcome such disadvantages, in this chapter, a method of checking reliability of the list in the middle of the decoding process through the methods of using multiple CRCs, the single parity bit or a combination thereof is proposed. Although multiple CRCs are used for convenience in this chapter, the single parity bit may be used or the multiple CRCs and the single parity bit may be simultaneously used.

Figure 13:
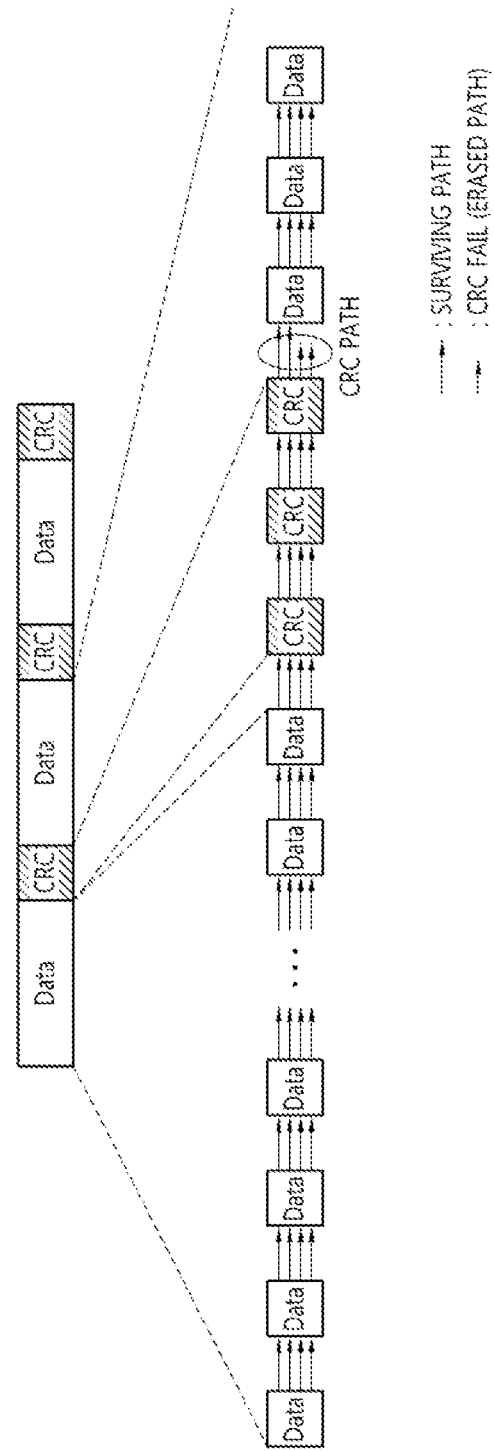
FIG. 13 is a view showing an example of a list decoding process.
Figure 14:
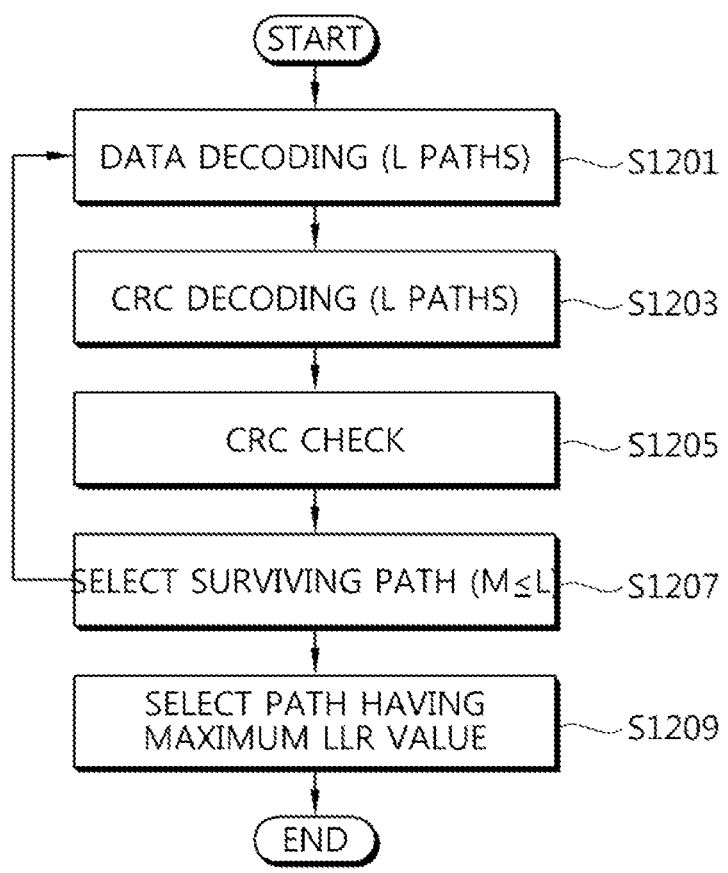
FIG. 14 is a flowchart illustrating the process shown in FIG. 13.

FIG. 13 is a view showing an example of a list decoding process, and FIG. 14 is a flowchart illustrating the process shown in FIG. 13.

First, in order to realize the proposal, assume that a transmission side and a reception side accurately know the positions of multiple CRCs. This may be estimated through the predetermined sizes of the data blocks and the multiple CRCs. If there is a plurality of predetermined values, it is possible to provide both the transmission side and the reception side with the sizes of used data blocks and multiple CRCs through exchange of information such as a control signal.

As shown in FIG. 14, the reception side sequentially performs decoding of the data blocks and multiple CRCs (S1201 and S1203) and determines whether an error occurs in multiple paths through CRC check at the position of the CRC block for error correction (S1205). For example, if there are N CRC blocks for error correction, error path checking is performed N times. In each error detection step using multiple CRCs, paths on which errors occur are erased from the list and only paths on which errors do not occur as the CRC checking result are left in the list as surviving paths (S1207) and are used for the decoding step. This process is performed with respect to all data blocks and multiple CRC blocks and, when decoding and CRC checking of all bits are completed, a final decoding path is determined using a measurement value such as LLR (S1209).

Multiple CRCs may be used for error correction to determine whether an error occurs on each path of list decoding and increasing reliability of the list or may be used for error detection to determine whether an error occurs in bits which are determined as a decoding path and are decoded.

Figure 15A:
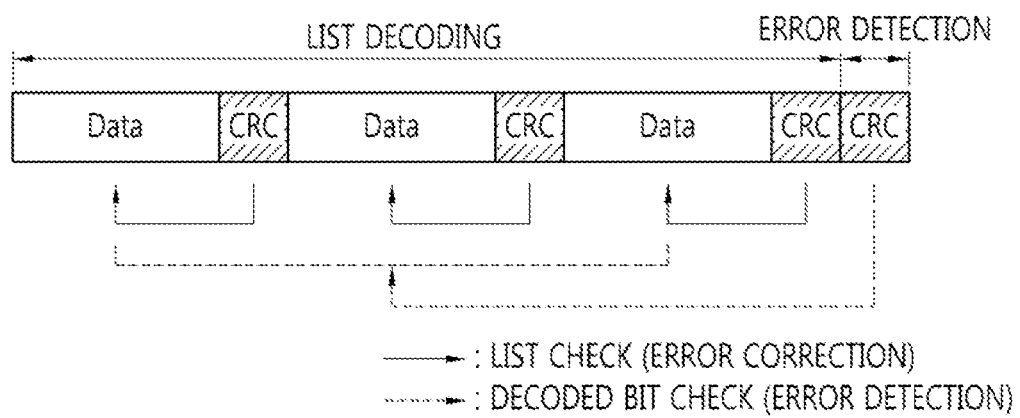
FIGS. 15A and 15B are views showing an example of using multiple CRCs.
Figure 15B:
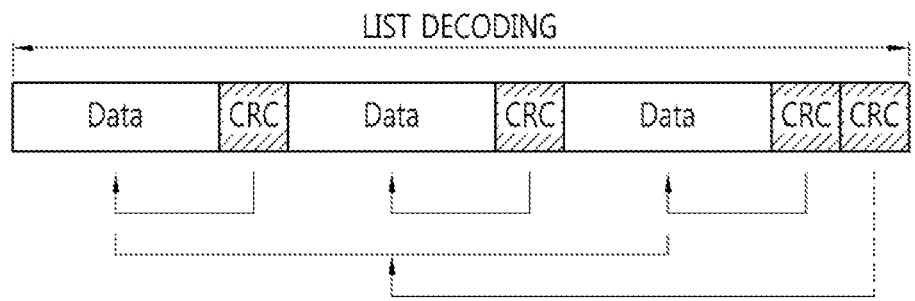

FIGS. 15A and 15B are views showing an example of using multiple CRCs.

As shown in FIG. 15A, if there are N data blocks and N+1 multiple CRCs, N multiple CRCs may be used for error correction of each data block and (N+1)-th CRC may be used for error detection. For example, in FIG. 15A, second CRC may be used for error correction of a second data block. In this case, a method of using up to an N-th multiple-CRC block to select a decoding path having a highest measurement value such as LLR through the list decoding process and using a resultantly derived decoding bit for error detection using an (N+1)-th multiple-CRC is applicable. Although last CRC performing error check with respect to all data blocks is described in FIG. 15A, a period in which error check is performed may be changed according to the CRC generation method.

The (N+1)-th multiple-CRC may be used for error detection, but may be used for error correction according to the situation of the reception side as shown in FIG. 15B. In this case, in a list decoder using L lists, if it is assumed that M(≤L) paths, to which error correction is applied after the N-th multiple-CRC are detected, a method of determining M'(≤M) paths again using (N+1)-th multiple-CRC is applicable. As shown in FIG. 15B, when CRC used for error detection and CRC used for list decoding are successively arranged in the last part, the decoding order may be determined according to the generation order of CRC. This will be described with reference to FIGS. 16A and 16B.

Figure 16A:
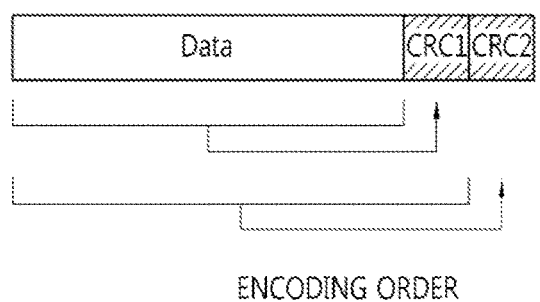
FIGS. 16A and 16B are views showing an example of the encoding and decoding order of multiple CRCs.
Figure 16B:
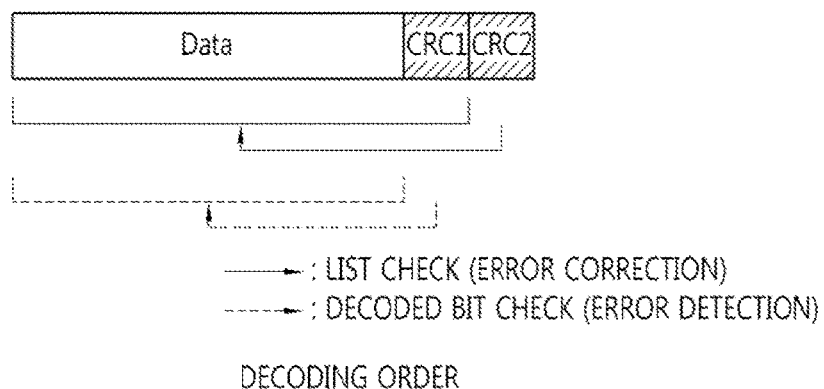

FIGS. 16A and 16B are views showing an example of the encoding and decoding order of multiple CRCs.

As shown in FIGS. 16A and 16B, for example, if CRC which reflects all data is CRC block 1 and CRC which reflects data and CRC block 1 is CRC block 2, the CRC encoding order is from CRC block 1 to CRC block 2 and the CRC decoding order is from CRC block 2 to CRC block 1. At this time, as the purpose of each CRC block, CRC block 1 may be used for error detection and CRC block 2 may be used for list decoding, in order to check the influence of an error, which may occur in CRC block 2, in CRC block 1 once in a first CRC check step. If CRC block 1 is first checked and then CRC block 2 is checked, a bit error, which may occur in CRC block 2, cannot be checked in a process of checking CRC block 1.

Specifically, referring to FIG. 16A, the encoding order may be determined to generate CRC1 for data and then to reflect the data and CRC1 to generate CRC2. In contrast, referring to FIG. 16B, the decoding order may be determined to use CRC2 with respect to the block including all data, CRC1 and CRC2 and then to use CRC1 with respect to the block including the data and CRC1. At this time, CRC1 may be used for error detection and CRC2 may be used for list check.

IV. Mapping of Data and CRC Bit (and/or Single Parity Bit)

If the above-described multiple CRCs (and/or the single parity bit) are used, a method of mapping data and CRC bits (and/or single parity bits) in an encoding process may be determined by reliability from the viewpoint of the input bit of an encoder. For example, in the case of a polar code, if the total bit number of the data and the CRC bits (and/or the single parity bits) is K, the K bits may be sequentially arranged in K bits having highest reliability from the viewpoint of the input bit. If K reliable bit positions are determined, the arrangement order of the data and the CRC bits (and/or the single parity bits) may be determined in consideration of the decoding order shown in FIG. 13. Here, for the sake of understanding, the reason why the reliability of each input bit of the polar code is different is as follows. First, as described above, the polarization effects of the polar code are changed according to input bit. Accordingly, there may be bits having higher reliability and bits having relatively low reliability among input bits which are input as data. Generally, in the structure shown in FIG. 4B, as the index of the input bit is increased, reliability is increased.

Figure 17:
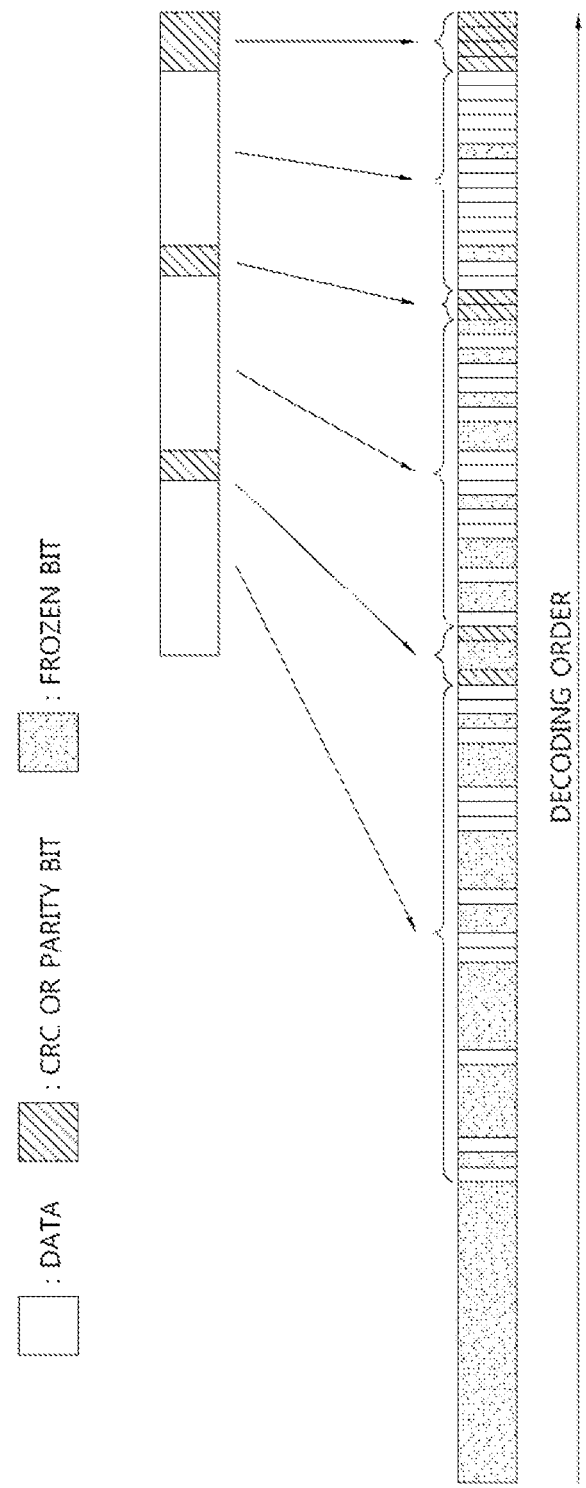
FIG. 17 is a view showing an example of arranging data bits and CRC bits (and/or single parity bits).

FIG. 17 is a view showing an example of arranging data bits and CRC bits (and/or single parity bits).

A frozen bit shown in FIG. 17 means a bit which is not used as data and CRC bit (and/or single parity bit) when the total size of the encoder of a polar code is N, and is filled with information known to the transmission side and the reception side. In FIG. 17, the data block and CRC bits (and/or the single parity bits) may be generated as described in Chapters I and II.

When the data block and the CRC block (and/or the single parity bit) are generated as described in Chapters I and II, a relationship between the data block and the CRC block (and/or the single parity bit) may consider reliability from the viewpoint of the encoder input bits. For example, in the case of the polar code, the reliabilities of the encoder input bits may have different values and some input bits may have a relatively higher error probability than the other input bits. In order to consider a difference in reliability, the CRC bit (and/or the single parity bit) may appear at a high frequency at positions earlier in the decoding order. That is, since a probability that an error occurs is low in the case of the input bits having high reliability, CRC may be added with low density. In contrast, since a probability that an error occurs is high in the case of input bits having low reliability, CRC may be added with high density. This will be described with reference to FIG. 18.

Figure 18:
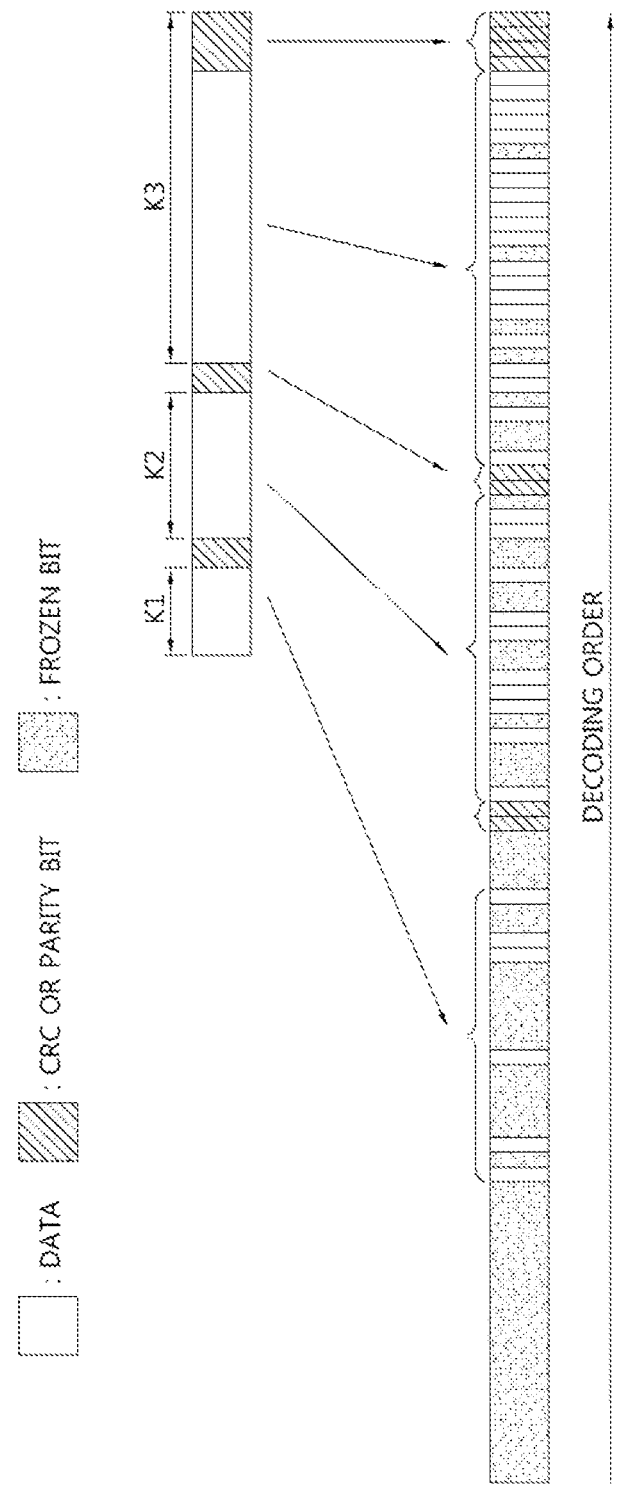
FIG. 18 is a view showing an example in which the sizes of successive data blocks distinguishable according to the position of CRC or a single parity bit differ.

FIG. 18 is a view showing an example in which the sizes of successive data blocks distinguishable according to the position of CRC or a single parity bit differ.

As shown in FIG. 18, the sizes of successive data blocks distinguishable according to the position of the CRC or single parity bit may differ from each other according to the decoding order. That is, in the example of FIG. 18, the earlier the decoding order, the shorter the data block, after which the CRC or the single parity bit appears. This serves to increase error detection capability with respect to input bits with relatively low reliability. At this time, the size of each data block may be defined by a ratio relative to each other.

V. Control Channel CRC Attachment

In a control channel such as a physical downlink control channel (PDCCH), scrambling of CRC may be used with a UE identity. Similarly, even in the multiple-CRC scheme proposed by the present invention, a UE may be identified through CRC. If control information such as a PDCCH is transmitted using CRC alone and the UE is identified through CRC, a false alarm rate (FAR) in which a decoder using list decoding may misjudge a signal thereof even when it is not a signal thereof is increased. However, as described above, if the multiple-CRC scheme is used and at least one CRC is used for error detection, the FAR of the UE may be reduced, thereby relatively increasing a probability that the UE identity is accurately distinguished. Accordingly, for the purpose of distinguishing the UE identity in the control channel, a multiple-CRC structure is more advantageous than an existing single CRC structure considering the UE using list decoding.

The scrambling method which may be used in a UE identity distinguishing method through scrambling of multiple CRCs proposed in this chapter may follow the following options.

Option 1: Method of applying scrambling to only one CRC used for error detection Option 2: Method of applying single scrambling to all CRCs Option 3: Method of applying the same scrambling to all CRCs Option 4: Method of applying different scrambling to CRCs In Option 1, scrambling is not applied to CRC used for list decoding but is applied to only CRC used for error detection. For example, when scrambling of CRC is used to represent an N-bit RNTI in N-bit CRC, a scrambling code having a length of N bits is used and applicable to CRC used for error detection. Since this is not so different from the method used in existing LTE, if the length of CRC used for error detection is equal to that of LTE, this method is advantageous from the viewpoint of backward compatibility of NR. In Option 2, one long scrambling is applied to the total length of multiple CRCs. For example, in order to represent an N-bit RNTI, an N-bit scrambling code may be generated, may be divided by a length of N/2 bits, and may be divisionally used in two CRCs each having a length of N/2 bits. In addition, this method may be extended to a method of dividing multiple CRCs into smaller groups and applying scrambling in group units. This method is advantageous in that it is possible to prevent the capability of distinguishing the UE identity from being reduced due to reduction in the length of one CRC by introduction of multiple CRCs. In Option 3, the same scrambling is applied to multiple CRCs. For example, when CRC scrambling is used to represent an N-bit RNTI, an N-bit scrambling code is generated and is equally applied to each CRC having a length of N bits. This method is advantageous in that influence of scrambling is checked plural times to check the UE identity plural times, thereby reducing the FAR. In Option 4, different scrambling is applied to CRCs. In this method, some CRCs may share the same scrambling. The method of applying different scrambling may serve to represent one UE identity in various manners. For example, in order to represent an N-bit RNTI, if an N-bit scrambling code is used and N-bit CRC has M blocks, M different scrambling codes for representing the same RNTI may be generated and respectively used for CRCs. This is advantageous in that the same UE identity is represented several times to reduce the influence of the FAR. Alternatively, one UE identity may be represented by a combination of a plurality of scrambling codes. For example, if two CRCs, each having a length of N/2, are used to represent an N-bit RNTI, the N-bit RNTI may be divided into two RNTI parts having a length of N/2 bits and a scrambling code corresponding to the RNTI part having the length of N/2 bits may be generated and applied to CRC having a length of N/2 bits. This may serve to compensate for a short length when the length of the RNTI and the length of the CRC block do not match. Alternatively, two or more different UE identities may be represented. For example, if there are an N-bit RNTI for the purpose of A and an M-bit RNTI for the purpose of B, independent scrambling codes corresponding to the N-bit length and the M-bit length may be generated and respectively used for CRC having a length of N bits and CRC having a length of M bits. At this time, N and M are arbitrary integers, which may be equal to or different from each other. This may allow for one UE to distinguish the control channel for two or more purposes.

The embodiments of the present invention can be implemented by a variety of means, for example, hardware, firmware, software, or a combination thereof. More specifically, the description will be made with reference to the drawings.

Figure 19:
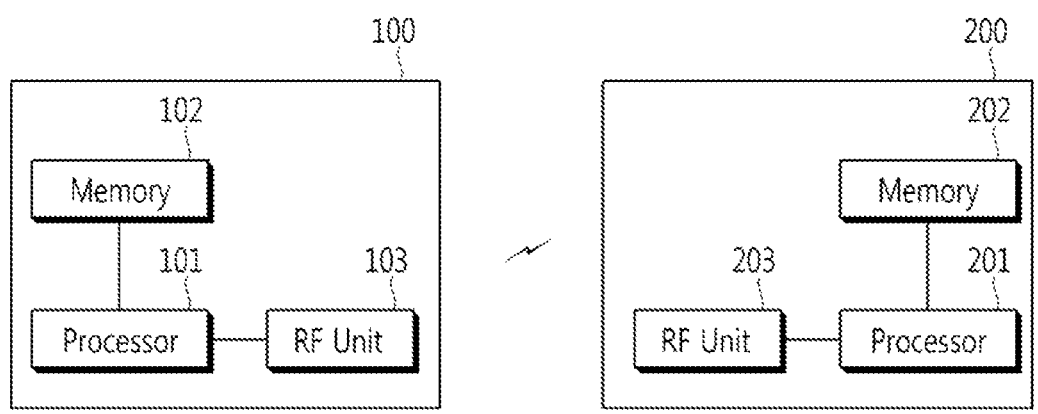
FIG. 19 is a block diagram showing a wireless communication system implemented by this disclosure.

FIG. 19 is a block diagram showing a wireless communication system implemented by this disclosure.

A base station 200 includes a processor 201, a memory 202 and a radio frequency (RF) unit 203. The memory 202 is connected to the processor 201 to store a variety of information for driving the processor 201. The RF unit 203 is connected to the processor 201 to transmit and/or receive a radio signal. The processor 201 implements the proposed function, process and/or method. In the above-described embodiment, operation of the base station may be implemented by the processor 201.

The UE 100 includes a processor 101, a memory 102 and an RF unit 103. The memory 102 is connected to the processor 101 to store a variety of information for driving the processor 101. The RF unit 103 is connected to the processor 101 to transmit and/or receive a radio signal. The processor 101 implements the proposed function, process and/or method.

The processor may include an application-specific integrated circuit (ASIC), another chipset, a logic circuit and/or a data processor. The memory may include a read-only memory (ROM), a random access memory (RAM), a flash memory, a memory card, a storage medium and/or another storage device. The RF unit may include a baseband circuit for processing the radio signal. When the embodiment is implemented in software, the above-described scheme may be implemented by a module (process, function, etc.) for performing the above-described function. The module may be stored in the memory and executed by the processor. The memory may be located inside or outside the processor and may be connected to the processor by various well-known means.

In the exemplary system described above, although the methods are described on the basis of a flowchart as a series of steps or blocks, the present invention is not limited to the order of steps, and some steps may be performed in order different from the order of the steps described above or at the same time. It will also be appreciated by those skilled in the art that the steps shown in the flowchart are not exclusive and that other steps may be included or that one or more steps in the flowchart may be eliminated without affecting the scope of the invention.

What is claimed is:

1. A transmitting device comprising:
   at least one transceiver; and
   at least one processor; and
   at least one memory operably connectable to the at least one processor and storing instructions that, when executed by the at least one processor, perform operations comprising:
   generating, based on data, an information bit sequence input for a polar code; and
   performing channel-encoding for the information bit sequence based on the polar code,
   wherein the information bit sequence includes data blocks 0 to N−1 related to the data and parity blocks 0 to N−1 in the order of data block 0, parity block 0, data block 1, parity block 1, . . . , data block N−1, parity block N−1, where N is an integer larger than 1, and
   wherein each parity block n of the parity blocks 0 to N−1 is generated based on bits included in data blocks 0 to n−1 and bits included in data block n only, among the data blocks 0 to N−1.

2. The transmitting device according to claim 1, wherein the data includes the data blocks 0 to N−1.

3. The transmitting device according to claim 1, wherein each parity block n of the parity blocks 0 to N−1 includes at least one cyclic redundancy check (CRC) bit.

4. The transmitting device according to claim 1, wherein each parity block n of the parity blocks 0 to N−1 is a single parity bit, and
wherein the information bit sequence further includes a cyclic redundancy check (CRC) block at an end of the information bit sequence.

5. The transmitting device according to claim 1, wherein each parity block n of the parity blocks 0 to N−1 includes no parity bit which is generated based on parity blocks 0 to n−1, parity blocks n+1 to N−1, and data blocks n+1 to N−1.

6. A method of performing channel-coding at a transmitting device, the method comprising:
   generating, based on data, an information bit sequence input for a polar code; and
   performing channel-encoding for the information bit sequence based on the polar code,
   wherein the information bit sequence includes data blocks 0 to N−1 related to the data and parity blocks 0 to N−1 in the order of data block 0, parity block 0, data block 1, parity block 1, . . . , data block N−1, parity block N−1, where N is an integer larger than 1, and
   wherein each parity block n of the parity blocks 0 to N−1 is generated based on bits included in data blocks 0 to n−1 and bits included in data block n only, among the data blocks 0 to N−1.

7. The method according to claim 6, wherein the data includes the data blocks 0 to N−1.

8. The method according to claim 6, wherein each parity block n of the parity blocks 0 to N−1 includes at least one cyclic redundancy check (CRC) bit.

9. The method according to claim 6, wherein each parity block n of the parity blocks 0 to N−1 is a single parity bit, and
wherein the information bit sequence further includes a cyclic redundancy check (CRC) block at an end of the information bit sequence.

10. The method according to claim 6, wherein each parity block n of the parity blocks 0 to N−1 includes no parity bit which is generated based on parity blocks 0 to n−1, parity blocks n+1 to N−1, and data blocks n+1 to N−1.

11. A receiving device comprising:
   at least one transceiver;
   at least one processor; and at least one computer memory operably connectable to the at least one processor and storing instructions that, when executed by the at least one processor, perform operations comprising:

receiving an encoded information bit sequence related to data; and performing channel-decoding on the encoded information bit sequence based on a polar code to obtain an information bit sequence, wherein the information bit sequence includes data blocks 0 to N−1 related to the data and parity blocks 0 to N−1 in the order of data block 0, parity block 0, data block 1, parity block 1, . . . , data block N−1, parity block N−1, where N is an integer larger than 1, and wherein each parity block n of the parity blocks 0 to N−1 is related to bits included in data blocks 0 to n−1 and bits included in data block n only, among the data blocks 0 to N−1.

12. The receiving device according to claim 11, wherein the data includes the data blocks 0 to N−1.

13. The receiving device according to claim 11, wherein each parity block n of the parity blocks 0 to N−1 includes at least one cyclic redundancy check (CRC) bit.

14. The decoding receiving device according to claim 11, wherein each parity block n of the parity blocks 0 to N−1 is a single parity bit, and wherein the information bit sequence further includes a cyclic redundancy check (CRC) block at an end of the information bit sequence.

15. The receiving device according to claim 11, wherein each parity block n of the parity blocks 0 to N−1 includes no parity bit which is related to parity blocks 0 to n−1, parity blocks n+1 to N−1, and data blocks n+1 to N−1.

16. A method of performing channel-decoding at a receiving device, the method comprising:

receiving an encoded information bit sequence related to data; and performing decoding on the encoded information bit sequence based on a polar code to obtain an information bit sequence, wherein the information bit sequence includes data blocks 0 to N−1 related to the data and parity blocks 0 to N−1 in the order of data block 0, parity block 0, data block 1, parity block 1, . . . , data block N−1, parity block N−1, where N is an integer larger than 1, and wherein each parity block n of the parity blocks 0 to N−1 is related to bits included in data blocks 0 to n−1 and bits included in data block n only, among the data blocks 0 to N−1.

17. The method according to claim 16, wherein the data includes the data blocks 0 to N−1.

18. The method according to claim 16, wherein each parity block n of the parity blocks 0 to N−1 includes at least one cyclic redundancy check (CRC) bit.

19. The method according to claim 16, wherein each parity block n of the parity blocks 0 to N−1 is a single parity bit, and wherein the information bit sequence further includes a cyclic redundancy check (CRC) block at an end of the information bit sequence.

20. The method according to claim 16, wherein each parity block n of the parity blocks 0 to N−1 includes no parity bit which is related to parity blocks 0 to n−1, parity blocks n+1 to N−1, and data blocks n+1 to N−1.

\* \* \* \* \*